Jan. 19, 1971 HIROZO MASE 3,555,914
CHANNEL SELECTION ASSEMBLY
Filed May 6, 1969 3 Sheets-Sheet 1
Fig. I
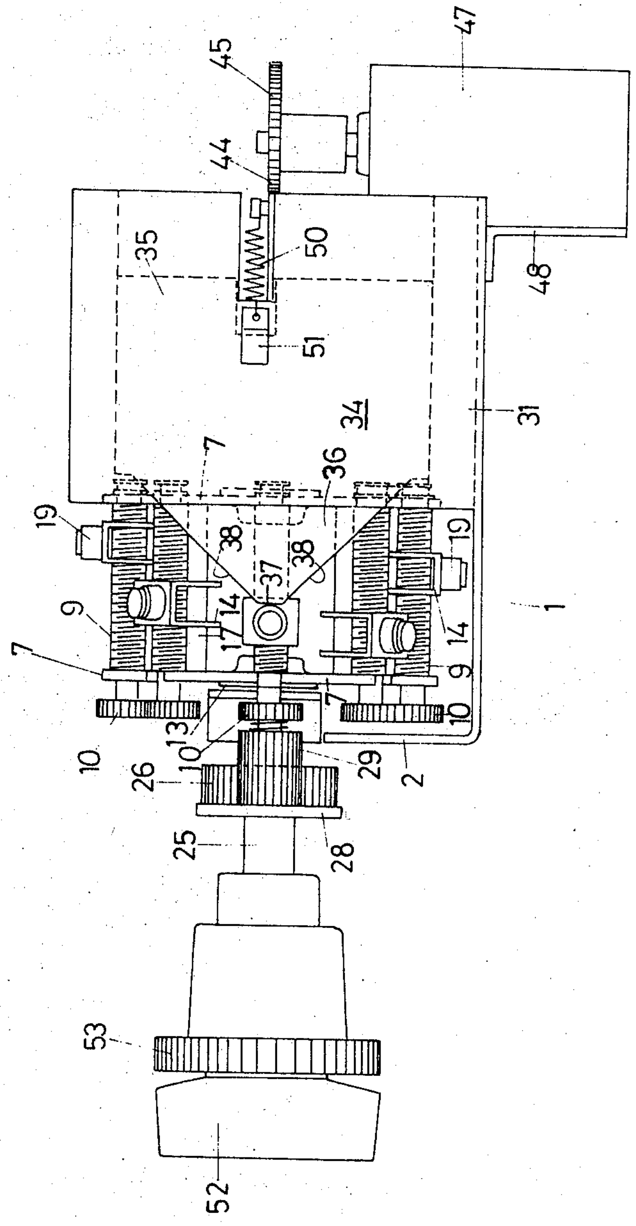

CHANNEL SELECTION ASSEMBLY

Filed May 6, 1969

3,555,914

CHANNEL SELECTION ASSEMBLY

Hirozo Mase, Tokyo, Japan, assignor to Mie Seisakusho Kabushiki Kaisha, Unoki Ohta-ku, Tokyo, Japan Filed May 6, 1969, Ser. No. 822,108
Claims priority, application Japan, Feb. 17, 1969, 44/11,096
Int. Cl. F16h *35/18*
U.S. Cl. 74—10.6 2 Claims

ABSTRACT OF THE DISCLOSURE

A channel selection assembly is provided which is adapted to be used as a tuner for UHF band television. The assembly includes a drum-shaped carrier constituted by a pair of plates mounted on a switching shaft, and a plurality of threaded members each associated with separate channel are mounted on the carrier for rotation. A U-shaped member threadably engages each threaded member and is adapted to move thereon when the latter rotates. A roller rotatably carried by each U-shaped member, upon rotation of the shaft, engages the tapering side edge of an axially slidable cam urged in one direction and shifts the cam to move tuning components to their desired channel position. Tuning positions of different channels are preset by the members, which additionally provide fine adjustment and allow for substantial change of channel frequencies.

Figure 3:
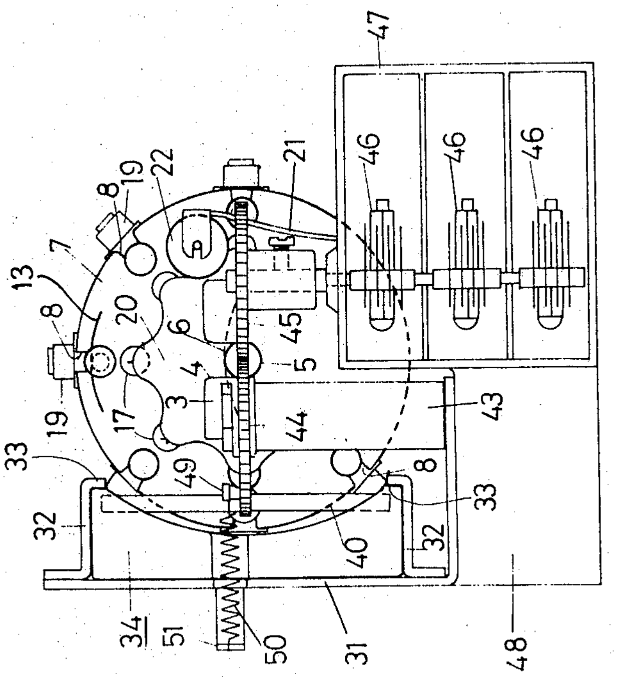

The invention relates to a switching mechanism for channel selection of a television receiver set, and more particularly to such mechanism with a plurality of threaded members each serving to preset the respective fine adjustment position of tuning component for a number of UHF (ultra-high frequency) channels.

Television channels commonly used throughout the world are those of VHF (very high frequency) band, but because of the limited number of channels allowed in such frequency band, a recent tendency for the television broadcasting is the use of channels in the UHF band. One channel involves a bandwidth of 6 mHz. or 8 mHz. and as many as fifty or more channels can be used in the UHF band. Various forms of tuners are known which are used for channel selection in the VHF band, but most of them provide a very limited extent of frequency adjustment by individual elements which are separately associated with different channels. Such type of tuners are not directly applicable to the selection of UHF channels, because although they operate satisfactorily in one district where there would be several channels, usually seven or eight, they cannot be used in another district where the frequency range of channels is sufficiently spaced from that of channels in said one district to exceed the extent of frequency adjustment provided by said individual elements. Thus the designation of channel ONE in one district may represent a channel extending from 470 to 476 mHz., while the channel ONE in another district may represent a channel extending from 716 to 722 mHz., which cannot be dealt with by the same tuner as used in the first district.

While very recently a different type of tuner has been proposed which has individual elements associated with different channels for providing fine tuning adjustment as usual and in which the elements additionally serve to vary the frequency range of their associated channels, when necessary, over the entire region of the UHF band used. This tuner thus can be used all over the districts irrespective of particular frequency range of any specific channel in any district, but its mechanical arrangement is expensive and involves operational difficulties because of the push-button system used. Specifically, there are provided a plurality of adjustment rods, each associated with a separate channel selection button, having respective threaded portions. The rods are arranged parallel to each other and a control element extends transversely of the rods for engagement with the threaded portion of any selected adjustment rod that is brought into its operative position by operation of an associated push-button. When engaged, the control element is angularly moved by rotation of the push-button to operate the tuning component, thereby providing fine adjustment. When another push-button is operated, the previously operated push-button will be reset and its associated adjustment rod is retracted axially to be disengaged from the control element. The resetting mechanism operates by engagement or abutment with a tapered portion or a shoulder on the adjustment rod, and this requires precise machining as well as cementation of the rod material. Cementation causes warping of the rod, which must be removed by cutting. When the push-button is operated repeatedly, the associated adjustment rod will advance and retract a substantial distance which approximately corresponds to the length of the threaded portion. Thus the length of the threaded portion is limited because of the space requirement and to avoid substantial movement of the rod. However, this results in a difficulty of maintaining good resettability, that is, to ensure that an adjustment rod for a given channel always provides an accurate positioning of the tuning component when operated repeatedly. In a color television set, the need for good resettability is essential because even a slight mismatching results in the unbalance of color.

In addition, it is desirable to provide a tuner that is operated by a rotatable dial.

Therefore, it is an object of the invention to overcome above disadvantages by providing an improved channel selection and adjustment mechanism which is operated by a rotatable dial knob.

Figure 2:
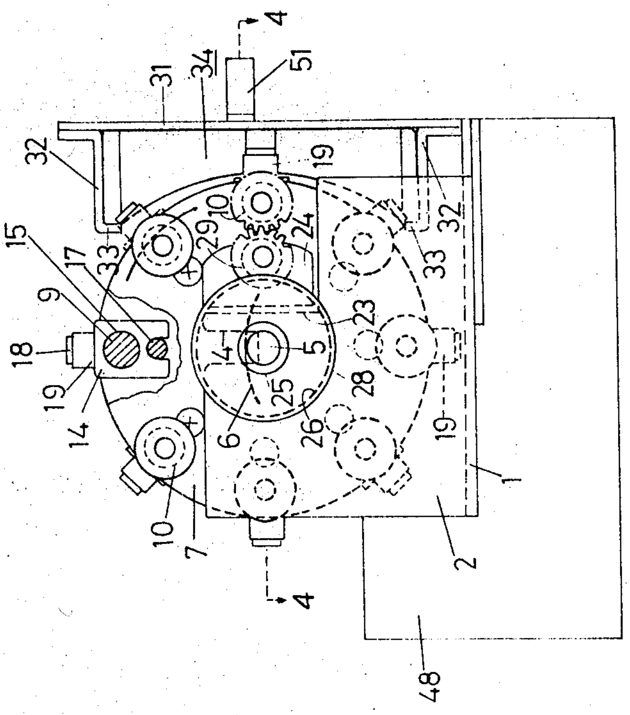
Figure 4:
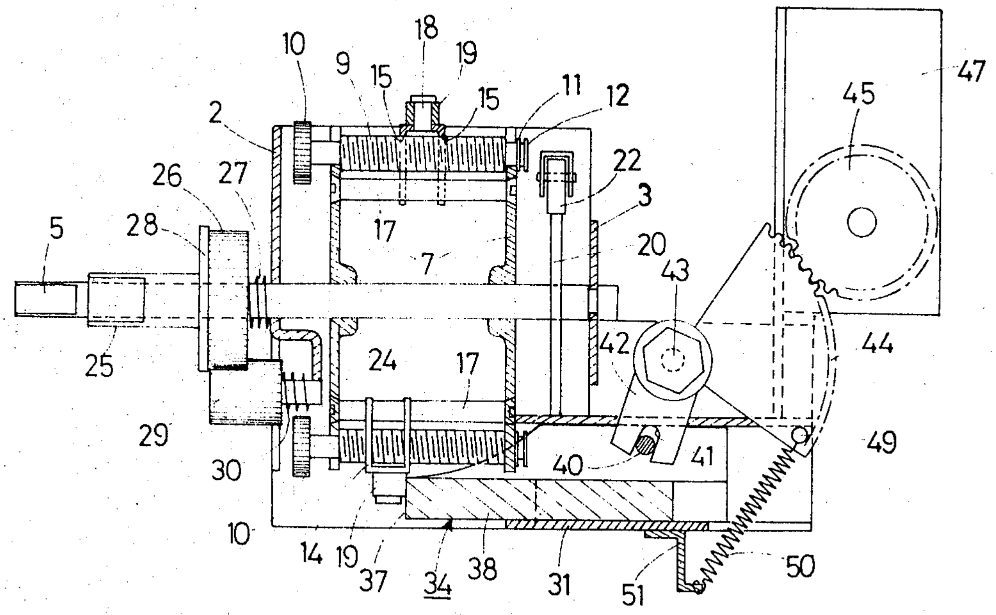
Figure 5:
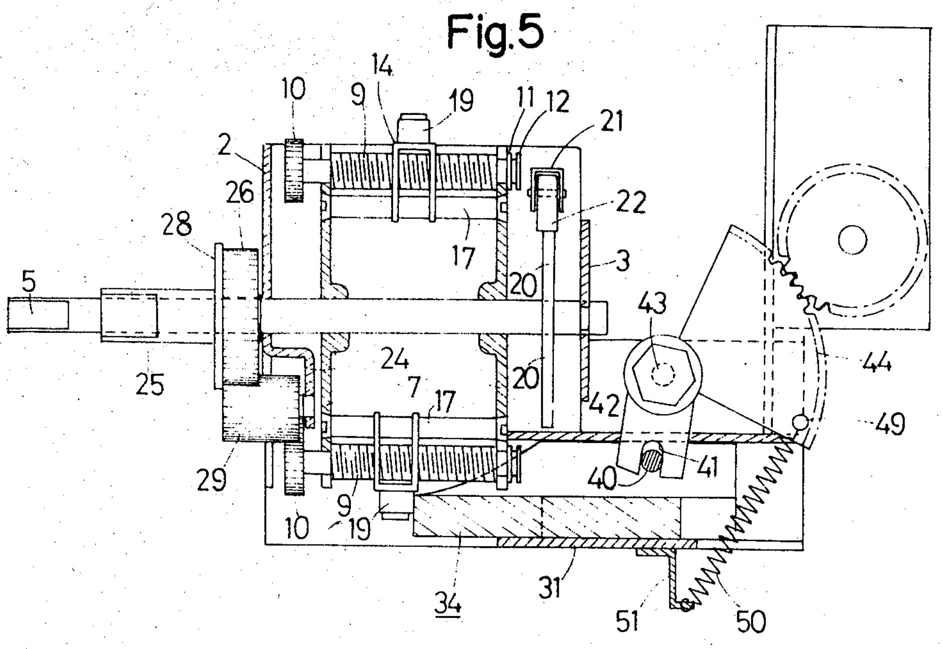

The invention will be described more fully with reference to the drawings which show one embodiment thereof and in which:

FIG. 1 is an elevation view, as seen from the right-hand side in FIG. 2, of the channel switching assembly according to the invention, FIG. 2 is a front view, partly broken away and in section, of the assembly with knobs being removed, FIG. 3 is a rear elevational view of the assembly, FIG. 4 is a section taken along the line 4—4 in FIG. 2, the fine adjustment mechanism being shown in its inoperative position, and FIG. 5 is a view similar to FIG. 4 showing the fine adjustment mechanism in its operative position.

Referring to the drawing, the channel switching assembly includes a generally U-shaped support member 1 having a pair of limbs 2 and 3 which are formed with grooves 4, respectively, for receiving a switching shaft 5. The shaft 5 is rotatably held in the grooves 4 by resilient wires 6 such as piano wires which are secured to the support member 1 at their both ends. The shaft 5 fixedly carries a pair of circular plates 7 of rigid material axially spaced apart a predetermined distance and extending in a plane perpendicular to the shaft 5. The both circular plates 7 are formed with a plurality of axially aligned grooves 8 (FIG. 3) along their periphery at a regular angular interval, eight such grooves 8 being provided in one plate 7 in the embodiment at an angular interval of 45°. Each pair of axially aligned grooves 8 receive the opposite ends of a threaded member 9, which are less in diameter than the diameter of the central threaded portion. The threaded member 9 carries a pinion 10 at its forward end and is formed with a pair of flanges 11, 12 (FIG. 4) at its other end. The width of the groove 8 is chosen close to the diameter of that portion of the threaded member 9 which has a reduced diameter and which extends between the rear end, or right-hand end as viewed in FIG. 4, of the threaded portion and the inner flange 11, and the length of said portion is chosen close to the thickness of the rear plate 7. By this arrangement, the threaded member 9 is correctly positioned on the circular plates 7 so as not to move axially, but to be rotatable. However, in order to compensate for any chattering that may be caused by the manufacturing and mounting tolerances, in a preferred form of the invention, a spring washer (not shown) is inserted between the rear end of the threaded portion and the inner surface of the rear circular plate 7, thereby urging the threaded member 9 forwardly. Each threaded member 9 is held in the grooves 8 by a resilient wire 13 (FIG. 3) which engages the rear end of the threaded member 9 between the flanges 11 and 12 and which has its ends secured to the rear plate 7. Only one such wire 13 is shown in FIG. 3, but it should be understood that there are provided the same number of them as the number of the threaded members 9. Associated with each of the threaded members 9 is a U-shaped member 14 which has threaded bores 15 in its both limbs, and the bores 15 threadably engage the threaded portion of the member 9 intermediate the ends thereof. The limbs have recesses 16 adjacent their free ends, which engage a pin 17. The pin 17 is secured at its ends to the circular plates 7 by suitable means and serves as a guide for the axial movement of the member 14 on the threaded member 9 as the latter is rotated by a drive applied to the pinion 10. Secured to the base of the member 14 as by crimping is a stud 18 which rotatably carries a roller 19.

The switching shaft 5 carries a detent plate 20 rearwardly of the plates 7, and the detent plate 20 has a number of cam lobes (FIG. 3), eight in the example shown, which define between them depressions or valleys. A leaf spring 21 is secured to the bottom of the support member 1 and extends vertically to a position where a roller 22 carried by the free end of the leaf spring 21 engages one of the depressions in the detent plate 20, thereby retaining the shaft 5 in one of its rotational positions.

As will be best seen in FIGS. 2, 4, and 5, the front limb 2 of the support member 1, which constitutes the panel of the assembly, is partly cut and bent at 23 rearwardly from the plane of the limb 2, and such part then extends parallel to the limb 2 to form a recessed support 24. A hollow shaft 25 is slidably and rotatably mounted on the switching shaft 5 and has a toothed wheel 26 secured to its inner end. A coiled spring 27 extends around the shaft 5 between the toothed wheel 26 and the front limb 2. An abutment plate 28 having a greater diameter than the toothed wheel 26 is fixed on the hollow shaft 25 adjacent the toothed wheel 26. An elongated gear 29 is slidably and rotatably carried by a shaft on the recessed support 24 and is normally urged away therefrom by a coiled spring 30. It will be noted from FIGS. 2 and 5 that the gear 29 is positioned so that it meshes with the toothed wheel 26 and can be brought into meshing engagement with one of the pinions 10 also when it is axially urged by the abutment plate 28 against the action of the spring 30. When the gear 29 engages the pinion 10 in this manner, rotation of the hollow shaft 25 causes an axial movement of the associated U-shaped member 14 on the threaded member 9. In FIG. 2, both the gear 29 and the pinion 10 are shown to have teeth along a part of their periphery, but actually they are provided with teeth over the whole periphery. It is to be noted that similar illustrations are used at other occurrences and the complete teeth are indicated by chain-dotted lines.

The base of the support member 1 is extended at its rear end to form a guide structure, which comprises an L-shaped plate 31 having a horizontal part as an extension of the base and an upright part to which are rigidly secured a pair of side plates 32. The side plates 32 have their free ends 33 bent toward each other and constitutes together with the upright part of the plate 31 a guide structure for the sliding movement in the axial direction of a cam 34 formed by a metal block of a relatively large mass. The cam 34 comprises a generally rectangular portion 35 which fits in the guide structure, and a generally triangular portion 36 contiguous with the portion 35 and having a relatively narrow, flat top edge 37. Intermediate its ends, the portion 36 has a pair of tapering side edges 38, thereby forming an isosceles triangle. As will be seen in FIG. 3, the inner surface of the rectangular portion 35 is formed concave in conformity to the profile of the circular plates 7 to provide a proper clearance therebetween, and the inner wall of the triangular portion 36 is also cut to similar shape. In addition, the thickness of the triangular portion 36 gradually decreases toward the top edge 37. The cam 34 is dimensioned and arranged such that in one of the rotational positions of the switching shaft 5, one of the rollers 19 rides on and abuts against the top edge 37.

Extending vertically across spaced points on the inner concave surface of the rectangular portion 35 of the cam 34 is a pin 40 which is engaged by an elongated groove 41 in a two-armed transmission member 42 rotatably carried by a stud 43 that is vertically mounted on the horizontal part of the plate 31. The other arm of the member 42 is in the form of a segment having peripheral teeth 44 which meshes with a toothed wheel 45 on the shaft of tuning components such as ganged variable condensers 46. These variable condensers are separately housed in partitioned compartments of a casing 47 that is secured to the plate 31 by an attachment plate 48. The segment has a pin 49 adjacent its one side, which is engaged by one end of a tension spring 50, the other end of which is tied to a detent 51 secured to the plate 31. It will be understood that the spring 50 urges the transmission member 42 clockwise and hence urges the cam 34 forwardly. It will be noted that the upright part of the plate 31 and a rear part of the cam 34 are notched to allow passage of the spring 50 therethrough.

In use, a channel selection dial knob 52 and a fine adjustment knob 53 are fitted with the shafts 5 and 25, respectively.

The operation of the channel switching assembly is as follows:

The knob 52 is turned to choose a desired channel. The detent plate 20 will be retained by its cooperating roller 22 in the desired channel position and one of the rollers 19 which engages the threaded member 9 associated with the selected channel will come to ride on the top edge 37 of the cam 34. Before this occurs, the cam 34 is forwardly biased by the spring 50 sufficiently to reach almost the forward end of the threaded member 9. As the roller 19 of the selected channel approaches the cam 34, it will initially abut against the tapering side edge 38 and in so doing, exert an urging pressure thereupon which has a component force to move the cam 34 rearwardly, that is, away from the front panel, against the action of the spring 50. Thus the roller 19 slides on the side edge 38 by moving the cam 34 until eventually it comes to rest on the flat top edge 37. During such movement of the cam 34, the transmission member 42 will be rotated counterclockwise, whereby the toothed wheel 45 will rotate clockwise to turn the tuning components 46 to the given channel tuning position. Then the knob 53 is pushed in against the action of the spring 27 as far as is permitted, whereby the abutment plate urges the gear 29 into engagement with the pinion 10 against the action of the spring 30 (FIG. 5). Subsequent rotation of the knob 53 causes an axial movement of the member 14 on the threaded shaft 9, and such movement of the member 14 provides fine adjustment of the tuning components by either urging the cam 34 further rearwardly or allowing it to move forwardly under the action of the spring 50. Upon release of the knob 53, it will return to its original position under the action of the spring 27, and the gear 29 will also return to its original position (FIG. 4). Next time the same channel is selected, the fine adjustment need not be operated because the associated U-shaped member 14 is already correctly positioned on the threaded member 9. It is contemplated that the length of the threaded member 9 is chosen such that when its associated U-shaped member 14 is driven from one end to the other of the threaded member, the movable plates of the tuning condensers 46 move from their fully closed position to their fully open position, thereby covering the entire region of the UHF band.

It will be noted that the spring 50 prevents any backlash between the pin 40 and the groove 41 in the transmission member 42. Also it will be understood that the precision of the fine adjustment is determined by the pitch of the thread on the threaded member 9 as well as the gear ratio of the parts 26, 29 and 10.

While the channel selection assembly has been shown to include eight threaded members 9, it will be obvious that the number of such members may be increased or decreased as required. However, it should be understood that when the number of threaded members 9 is increased, there will be a necessity to change either the diameter of the circular plates 7 or the width of the triangular portion 36 of the cam 34 so as to permit the whole length of the threaded members 9 to be effective for adjustment. The maximum width of the triangular portion 36 will be determined by the distance, as measured circumferentially, between adjacent threaded members 9. The triangular portion 36 must be axially long enough to engage, with its top edge 37, the roller 19 that is positioned foremost on the associated threaded member 9, and at the same time it must not interfere with the members 14 on the adjacent threaded members 9. Thus when the number of the threaded members 9 is increased without increasing the diameter of the circular plates 7, the width of the triangular portion 36 will have to be reduced, and then the side edge 38 will have a reduced angle of inclination with respect to the longitudinal axis with the result that the roller 19, when abutting against the side edge 38, will exert a reduced component force to move the cam 34 axially. However, for practical purposes, the width of the triangular portion 36 at the junction with the rectangular portion 35 need not be less than the distance between one threaded member 9 and the next to the adjacen one, since it is unlikely that adjacent channels have frequencies at the opposite extremities of the UHF band which is to be entirely covered by each of the threaded members 9. The flat top edge 37 of the cam 34 allows for a slight misalignment of the roller 19.

In one example, eight threaded members 9 made from brass of 30 mm. in length and 6 mm. in diameter and having a pitch of 0.5 mm. were mounted on a pair of circular plates 7 having a diameter of 60 mm. The member 14 had a width of 8 mm. across its limbs and was prepared from soft steel plate 1 mm. thick, tapping threaded bores 15 at a pitch of 0.5 mm. Polished steel rod, cemented, was caulked to the base of the member 14 to provide the stud 18, on which was fitted the roller 19 made from carbon tool steel. The cam 34 was prepared from cemented, soft steel plate to provide abrasion resistance. The toothed wheel 45 comprised a pair of similar plates placed one above another, one of which was securedly mounted on the shaft of the tuning components and the other was loosely fitted on the shaft and resiliently urged in the circumferential direction, thereby avoiding the backlash between the teeth on the parts 44 and 45. To avoid undue play of the member 14 on the threaded member 9, the limbs of the U-shaped member 14 were widened or narrowed after mounting to cause the thread of the bore 15 to engage the threaded member 9 with a proper pressure. The assembly thus constructed exhibited good resettability well within ±0.5 mHz. which is normally considered as the allowable limit for color television.

It will be apparent that various modifications can be made to the embodiment shown without departing from the spirit of the invention. Gearing used may be suitably adapted to increase the tuning frequency when the knob 53 is turned clockwise or vice versa. Also the knob 53 and its associated parts may be constructed in known manner such that the hollow shaft 25, when pressed in, remains latched in its depressed position to allow free rotation of the knob 53 without manually holding it pressed, and returns to its original position when the switching shaft 5 is operated subsequently. When the assembly described is used in another district where channel frequencies are substantially different from those already preset, the only adjustment needed is to turn the knob 53 for every channel to find the optimum tuning position. Once this is completed, the assembly provides correct tuning subsequently.

What is claimed is:

1. A channel switching assembly comprising a switching shaft rotatably mounted on a support, means for latching the switching shaft in one of a number of preset rotational positions, a pair of circular plates of essentially the same diameter secured to the shaft and axially spaced apart a predetermined distance, a plurality of threaded members extending across and rotatably carried by the plates, the threaded members being disposed equiangularly along the periphery of the plates and each having a pinion at its one end beyond one of the plates, a plurality of U-shaped members associated one with each of the threaded members, said U-shaped members being in threadable engagement with the respective threaded members, means holding said U-shaped members against rotation, a plurality of rollers each rotatably mounted on a respective U-shaped member to extend radially outwardly of the periphery of the plates, a hollow shaft mounted slidably and rotatably on said switching shaft on one side of the plates, said hollow shaft carrying a toothed wheel adjacent its end near the plates and being adapted to move axially between an inoperative position and an operative position in which the toothed wheel is brought into operative driving engagement with one of the pinions, resilient means normally urging the toothed wheel toward said inoperative position, means for causing the toothed wheel to rotate, thereby enabling a U-shaped member to be positioned on its associated threaded member, a cam arranged axially slidably adjacent the plates and having at least one axially tapering said edge and a flat top edge, and second resilient means for normally urging the cam so that the top edge of the cam is positioned adjacent said one of the plates, the cam being positioned such that when the switching shaft is latched in one of the preset rotational positions, the top edge of the cam is engaged by the roller associated with the threaded member which has its pinion in position to be brought into operative engagement with the toothed wheel when the hollow shaft is manually moved to its operative position, the cam being adapted, during rotation of the switching shaft from one preset position to another, to be moved axially against the action of said second resilient means by the engagement of a roller with the tapering side edge until the roller comes to rest on the top edge, and means for transmitting the axial movement of the cam to tuning components to provide a desired frequency adjustment.

2. A channel switching assembly according to claim 1, in which the cam has a pair of axially tapering side edges converging to said narrow flat top edge.

References Cited

UNITED STATES PATENTS

| | | | |
|---|---|---|---|
| 3,415,127 | 12/1968 | Miner et al. -------- | 74—10.6 |
| 3,459,055 | 8/1969 | Sperber ------------- | 74—10.6 |

MILTON KAUFMAN, Primary Examiner

U.S. Cl. X.R.

74—10.54, 10.85